United States Patent
Xiang

(10) Patent No.: US 6,849,527 B1
(45) Date of Patent: Feb. 1, 2005

(54) STRAINED SILICON MOSFET HAVING IMPROVED CARRIER MOBILITY, STRAINED SILICON CMOS DEVICE, AND METHODS OF THEIR FORMATION

(75) Inventor: Qi Xiang, San Jose, CA (US)

(73) Assignee: Advanced Micro Devices, Sunnyvale, CA (US)

(*) Notice: Subject to any disclaimer, the term of this patent is extended or adjusted under 35 U.S.C. 154(b) by 0 days.

(21) Appl. No.: 10/684,727

(22) Filed: Oct. 14, 2003

(51) Int. Cl.[7] .................... H01L 21/425; H01L 21/265; H01L 21/336

(52) U.S. Cl. .................. 438/528; 438/520; 438/518; 438/303; 438/285; 438/199; 438/197

(58) Field of Search ................... 438/528, 520, 438/518, 303, 285, 199, 197

(56) References Cited

U.S. PATENT DOCUMENTS 6,303,450 B1 * 10/2001 Park et al. ............... 438/300
6,358,806 B1    3/2002 Puchner
6,492,216 B1 * 12/2002 Yeo et al. ................ 438/197
6,555,839 B2 *  4/2003 Fitzgerald ................ 257/18
6,689,671 B1 *  2/2004 Yu et al. .................. 438/486

* cited by examiner

Primary Examiner—Michael Trinh
(74) Attorney, Agent, or Firm—Foley & Lardner LLP

(57) ABSTRACT

The mobility enhancement of a strained silicon layer is augmented through incorporation of carbon into a strained silicon lattice to which strain is also imparted by an underlying silicon germanium layer. The presence of the relatively small carbon atoms effectively increases the spacing within the strained silicon lattice and thus imparts additional strain. This enhancement may be implemented for any MOSFET device including silicon on insulator MOSFETs, and is preferably selectively implemented for the PMOS components of CMOS devices to achieve approximately equal carrier mobility for the PMOS and NMOS devices.

20 Claims, 6 Drawing Sheets

STRAINED SILICON MOSFET HAVING IMPROVED CARRIER MOBILITY, STRAINED SILICON CMOS DEVICE, AND METHODS OF THEIR FORMATION

BACKGROUND OF THE INVENTION

1. Field of the Invention

The present invention relates to semiconductor integrated circuits, and in particular to semiconductor devices that incorporate strained silicon.

2. Related Technology

The continuous demand for improved performance in electronic devices has been addressed through advances in silicon processing and device technologies that are directed toward reduction in the size of individual semiconductor circuit components. However, economic and physical constraints are making continued reduction of device sizes more difficult, and so alternative solutions for increasing device performance are being sought.

One option for increasing the performance of MOSFETs is to enhance the carrier mobility of silicon so as to reduce resistance and power consumption and to increase drive current, frequency response and operating speed. A method of enhancing carrier mobility that has become a focus of recent attention is the use of silicon material to which a tensile strain is imparted. "Strained" silicon may be formed by growing a layer of silicon on a silicon germanium substrate. The silicon germanium lattice is generally more widely spaced than a pure silicon lattice as a result of the presence of the larger germanium atoms in the lattice. Because the atoms of the silicon lattice grow in alignment with the more widely spread silicon germanium lattice, a tensile strain is created in the silicon layer. The silicon atoms are essentially pulled apart from one another. The amount of tensile strain applied to the silicon lattice increases with the proportion of germanium in the underlying silicon germanium lattice.

Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 400 to 1000 times less than in relaxed silicon. As a result, carrier mobility is dramatically increased in strained silicon as compared to relaxed silicon, offering a potential increase in the mobility of both electrons and holes. The increase in mobility has been found to persist for current fields of up to 1.5 megavolts/centimeter. These factors are believed to enable a device speed increase of 35% without further reduction of device size, or a 25% reduction in power consumption without a reduction in performance.

An example of a MOSFET using a strained silicon layer is shown in FIG. 1. The MOSFET is fabricated on a substrate comprising a silicon germanium layer 10 on which is grown an epitaxial layer of strained silicon 12. The MOSFET uses conventional MOSFET structures including deep source and drain regions 14, shallow source and drain extensions 16, a gate oxide layer 18, a gate 20 surrounded by spacers 22, 24, silicide source and drain contacts 26, a silicide gate contact 28, and shallow trench isolations 30. The channel region 32 of the MOSFET includes the strained silicon material, which provides enhanced carrier mobility between the source and drain.

While the incorporation of strained silicon in MOSFETs can enhance MOSFET performance, those enhancements are more easily achieved in NMOS devices than in PMOS devices. FIG. 2 shows a graph relating the mobility enhancement of the electrons and holes of a strained silicon layer to the percentage of germanium in a silicon germanium substrate supporting the strained silicon layer. As shown in FIG. 2, a germanium content of 20% produces a significant enhancement of electron mobility but only a slight enhancement of hole mobility. A germanium content of approximately 30% is required in order to achieve significant and approximately equal mobility enhancement for both holes and electrons. However, in practice it is difficult to achieve a strained silicon layer of a useful thickness that is supported on a silicon germanium layer having approximately 30% germanium content. It has been determined that a strained silicon layer has a critical thickness, above which dislocations between the lattices of the strained silicon and the supporting layer, referred to as misfit dislocations, become significantly more likely to occur. Misfit dislocations release the strain imparted to the strained silicon layer and therefore degrade carrier mobility. The critical thickness of a strained silicon layer depends on the amount of tensile strain applied to the silicon lattice, and thus on the germanium content of the underlying silicon germanium layer. For example, it has been determined that a silicon germanium layer having approximately 20% germanium content can support a critical thickness of approximately 200 Angstroms without the risk of significant misfit dislocations, whereas a silicon germanium layer having approximately 30% germanium content can support a critical thickness of only approximately 80 Angstroms. In practical applications, this limitation makes significant enhancement in PMOS devices difficult. For example, it has been determined empirically that a strained silicon thickness of at least approximately 70 Angstroms is required in order to provide a meaningful improvement in NMOS performance. However, in order to account for consumption of the strained silicon layer during processing, a layer of approximately 150 Angstroms must be formed initially, and to avoid misfit dislocation in a layer of that thickness, the germanium content of the underlying layer must be restricted to approximately 20%. While the strain imparted by a 20% germanium content will produce significant carrier mobility enhancement in NMOS devices, PMOS devices incorporating the same strained silicon layer will gain relatively little carrier mobility enhancement. Therefore it is difficult to provide a meaningful application of strained silicon where both NMOS and PMOS devices are to be formed from the same layer of strained silicon. This problem is exacerbated in CMOS devices, where it is highly desirable for the PMOS and NMOS devices to have approximately the same carrier mobility and hence approximately the same drive current so that device speed and performance is not limited to that of the slower type of device. The conventional solutions to this problem in silicon CMOS devices, such as increasing the relative size of the PMOS devices or increasing the drive voltage of the PMOS devices, are equally undesirable in both silicon devices and strained silicon devices because of the greater complexity and size that they entail.

Therefore, while the limiting factors of strained silicon technology can be balanced to achieve improved carrier mobility enhancement in NMOS applications, current technology does not offer a way to impart enough strain to reliably produce comparable carrier mobility enhancements in PMOS devices or CMOS devices.

SUMMARY OF THE INVENTION

It is an object of the invention to provide a strained silicon MOSFET that has tensile strain in the strained silicon layer that is greater than the strain imparted by an underlying silicon germanium layer.

It is a further object of the invention to provide strained silicon PMOS devices and NMOS devices that incorporate the same strained silicon layer and in which the PMOS and NMOS devices have approximately the same degree of carrier mobility enhancement.

In accordance with embodiments of the invention, the carrier mobility enhancement of a strained silicon layer is augmented through incorporation of carbon into a strained silicon lattice to which strain is also imparted by an underlying silicon germanium layer. The presence of the relatively small carbon atoms in the strained silicon lattice effectively increases the spacing within the strained silicon lattice and thus imparts additional strain. This enhancement may be implemented for any MOSFET device, and may be selectively implemented for PMOS devices, such as PMOS components of CMOS devices, to achieve approximately equal carrier mobility enhancement for the PMOS and NMOS components.

In accordance with one embodiment of the invention, a strained silicon MOSFET having enhanced carrier mobility is fabricated. Initially a substrate is provided. The substrate includes a layer of silicon germanium and a layer of strained silicon grown on the layer of silicon germanium. The substrate also includes shallow trench isolations defining active regions for formation of MOSFETs. Carbon is then implanted into the strained silicon of an active region. A MOSFET comprising the carbon implanted strained silicon layer is then formed in the active region.

In accordance with another embodiment, MOSFETs and CMOS devices having enhanced carrier mobility are fabricated. Initially a substrate is provided. The substrate includes a layer of silicon germanium and a layer of strained silicon grown on the layer of silicon germanium. The substrate further includes shallow trench isolations defining respective active regions for formation of NMOS and PMOS devices. Carbon is then selectively implanted into the strained silicon of the PMOS active regions, for example using a photoresist mask of appropriate thickness as an implant mask. In one preferred embodiment, the amount of implanted carbon is chosen such that the hole mobility in the PMOS strained silicon is made to be approximately the same as the electron mobility in the NMOS strained silicon. The mask is then removed, and PMOS and NMOS devices that incorporate the strained silicon layer are formed in the respective PMOS and NMOS active regions of the substrate. Respective PMOS and NMOS devices may thereafter be electrically connected to form CMOS devices.

In accordance with another embodiment of the invention, a MOSFET is characterized by a strained silicon layer to which tensile strain is imparted by an underlying silicon germanium layer, and that contains carbon for imparting additional tensile strain. The MOSFET may be a PMOS device that is coupled with a strained silicon NMOS device having no carbon or a smaller amount of carbon to form a CMOS device. The PMOS device may be selectively implanted with carbon to balance its carrier mobility with that of the associated NMOS device.

DESCRIPTION OF THE DRAWINGS

Embodiments of the invention are described in conjunction with the following drawings, in which.

DESCRIPTION OF PREFERRED EMBODIMENTS

Figure 3A:
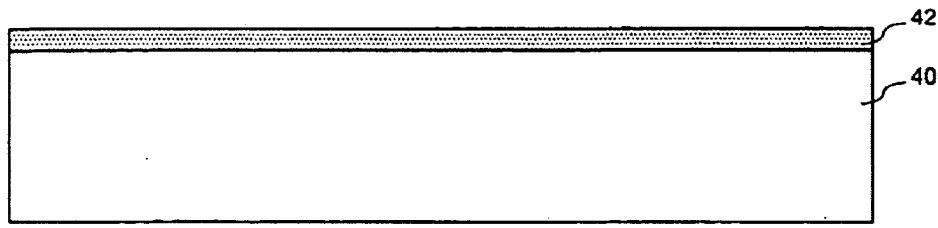
FIGS. 3a, 3b, 3c, 3d, 3e, 3f, 3g, 3h, 3i and 3j show structures formed during production of a MOSFET in accordance with a preferred embodiment of the invention.

FIGS. 3a–3j show structures formed during fabrication of a strained silicon MOSFET in accordance with a preferred embodiment of the invention. FIG. 3a shows a structure comprising a silicon germanium layer 40. The silicon germanium layer 40 preferably has a composition $Si_{1-x}Ge_x$, where x is approximately 0.2, and is more generally in the range of 0.1 to 0.3. The silicon germanium layer 40 is typically grown on and supported by a silicon wafer (not shown). Silicon germanium may be grown, for example, by chemical vapor deposition using $Si_2H_6$ (disilane) and $GeH_4$ (germane) as source gases, with a substrate temperature of 600 to 900 degrees C., a $Si_2H_6$ partial pressure of 30 mPa, and a $GeH_4$ partial pressure of 60 mPa. $SiH_4$ (silane) may be used in alternative processes. Growth of the silicon germanium layer 40 may be initiated using these ratios, or alternatively the partial pressure of $GeH_4$ may be gradually increased beginning from a lower pressure or zero pressure to form a gradient composition having the desired germanium content (e.g. 20%) at an upper portion that will form a junction with a later formed strained silicon layer.

A strained silicon layer 42 is grown on the silicon germanium layer 40. The strained silicon layer 42 is preferably grown by selective epitaxial growth through a chemical vapor deposition-(CVD) process, for example using $Si_2H_6$ as a source gas with a partial pressure of 30 mPa and a substrate temperature of approximately 600 to 900 degrees C. The strained silicon layer 42 and the silicon germanium layer 40 are preferably grown in a single continuous in situ deposition process. This may be achieved by discontinuing the flow of germanium source gas (e.g. germane) into the deposition chamber after a desired thickness of silicon germanium has been grown in order to change the composition of the deposited material from silicon germanium to silicon.

Figure 3B:
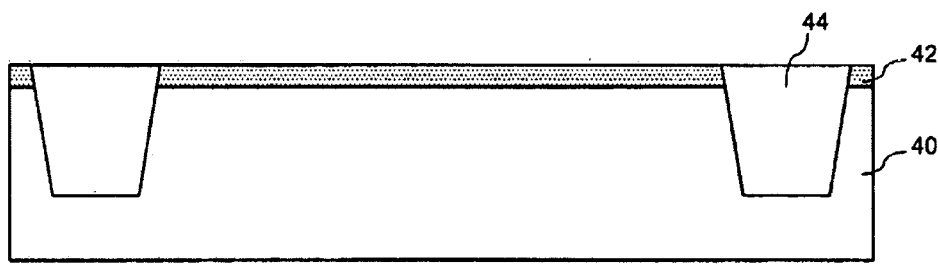

FIG. 3b shows the structure of FIG. 3a after formation of shallow trench isolations 44. The shallow trench isolations 44 may be formed by forming trenches having tapered sidewalls in the silicon germanium 40 and strained silicon 42 layers, performing a brief thermal oxidation, and then depositing a layer of silicon oxide to a thickness that is sufficient to fill the trenches, such as by low pressure CVD (LPCVD) TEOS or atmospheric pressure ozone TEOS. The silicon oxide layer is then densified and planarized such as by chemical mechanical polishing or an etch back process, leaving shallow trench isolations 44 that are approximately level with the surface of the strained silicon layer 42.

Figure 3C:
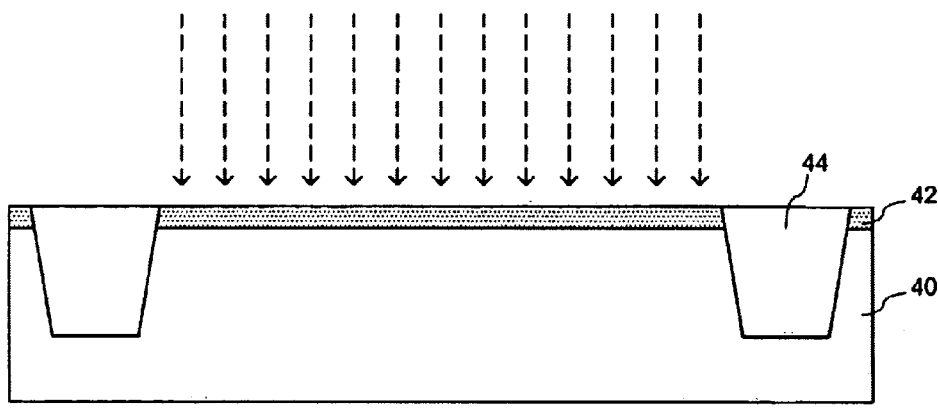

FIG. 3c shows the structure of FIG. 3b during implantation of carbon into the strained silicon layer to form a strained silicon carbon alloy having a greater carrier mobility than the strained silicon prior to implantation. It has been found that the amount of strain created by a given dose of carbon in the strained silicon lattice is approximately ten times the amount of strain created by an equal dose of germanium in the underlying silicon germanium lattice. In other words, a silicon layer comprising 1% carbon experiences an amount of strain that is approximately equal to that imparted by a silicon germanium layer having 10% germanium. Thus, for example, given a strained silicon layer that is supported by a silicon germanium layer having a 20% germanium content, the effective strain on the silicon germanium can be raised to approximately that provided by a 30% germanium layer by implanting the strained silicon layer with carbon to have approximately. 1% carbon content. Assuming the strained silicon layer is approximately 100 Angstroms in thickness, an appropriate implantation dose of 4 to $5 \times 10^{15}$ cm$^2$ is provided at an energy of approximately 2.5 KeV. The energy and dose may be adjusted in accordance with the particular implementation to provide the desired implantation depth and strain increase. After implantation, the carbon is preferably activated with minimal diffusion using a spike anneal such as a laser thermal anneal.

Figure 3D:
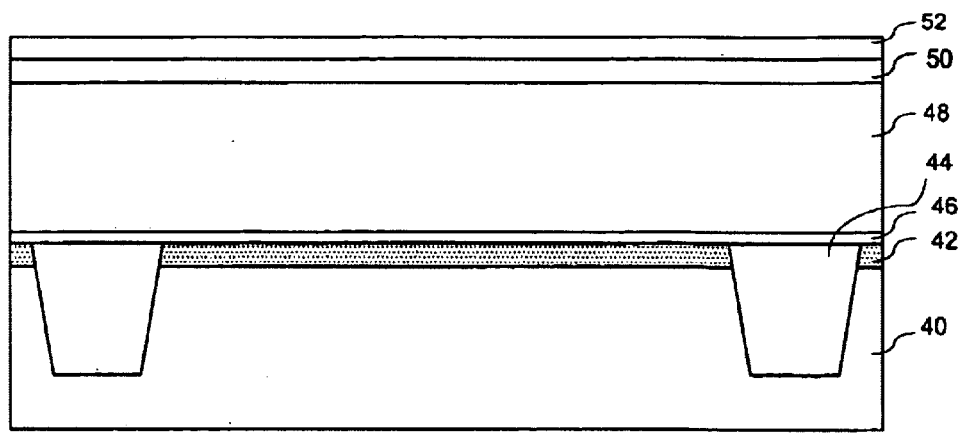

FIG. 3d shows the structure of FIG. 3c after formation of several layers of different materials over the strained silicon layer 42. The layers of material that are formed include a gate insulating layer 46 that is formed on the strained silicon layer 42. The gate insulating layer 46 is typically silicon oxide but may be another material such as a nitrided oxide (oxide-nitride-oxide, ONO). An oxide may be grown by thermal oxidation of the strained silicon layer 42, or may be deposited by chemical vapor deposition. Formed over the gate insulating layer 46 is a gate conductive layer 48. The gate conductive layer 48 typically comprises polysilicon but may alternatively comprise another material such as polycrystalline silicon germanium. Overlying the gate conductive layer 48 is a bi-layer hardmask structure comprising a bottom hardmask layer 50, also referred to as a bottom antireflective coating (BARC), and an upper hardmask layer 52. The bottom hardmask layer 50 is typically silicon oxide (e.g. SiO$_2$) and the upper hardmask layer 52 is typically silicon nitride (e.g. Si$_3$N$_4$).

Figure 3E:
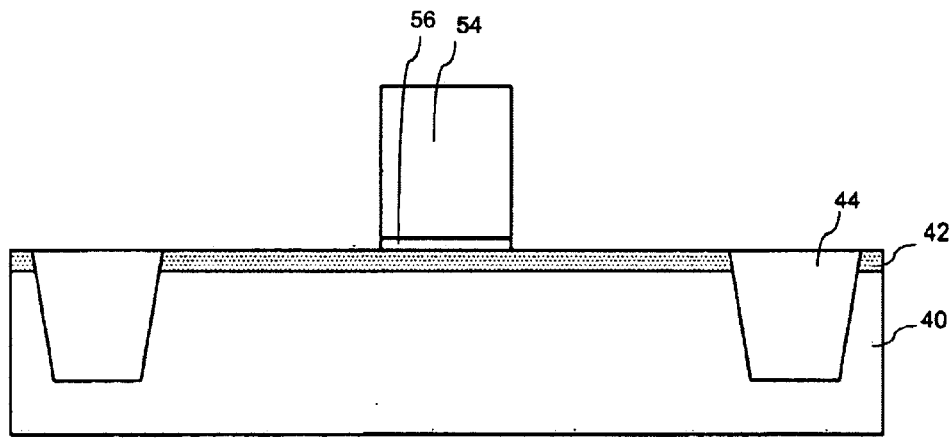

FIG. 3e shows the structure of FIG. 3d after patterning of the gate conductive layer and gate insulating layer to form a gate 54 and a gate insulator 56. Patterning is performed using a series of anisotropic etches that patterns the upper hardmask layer using a photoresist mask as an etch mask, then patterns the lower hardmask layer using the patterned upper hardmask layer as an etch mask, then patterns the gate conductive layer using the patterned lower hardmask layer as an etch mask, then patterns the gate insulating layer using the gate 54 as a hardmask.

Figure 3F:
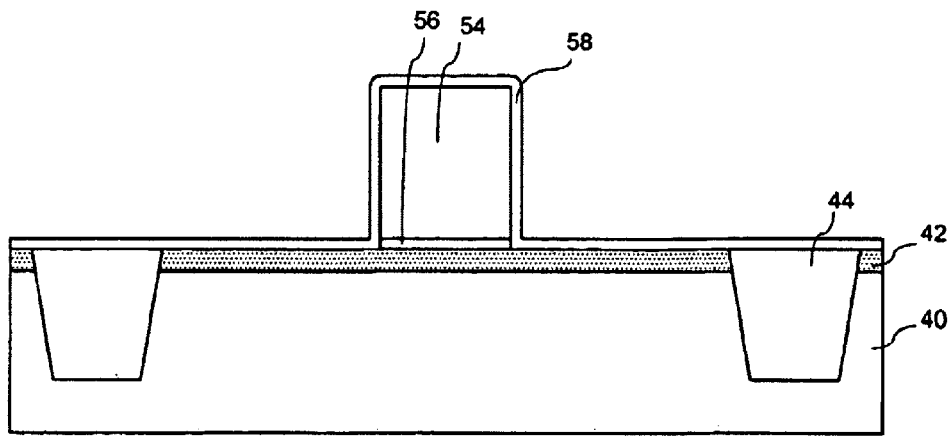

FIG. 3f shows the structure of FIG. 3e after formation of a protective layer 58 around the gate 54 and over the strained silicon layer 42. The protective layer may be formed by a brief thermal oxidation.

Figure 3G:
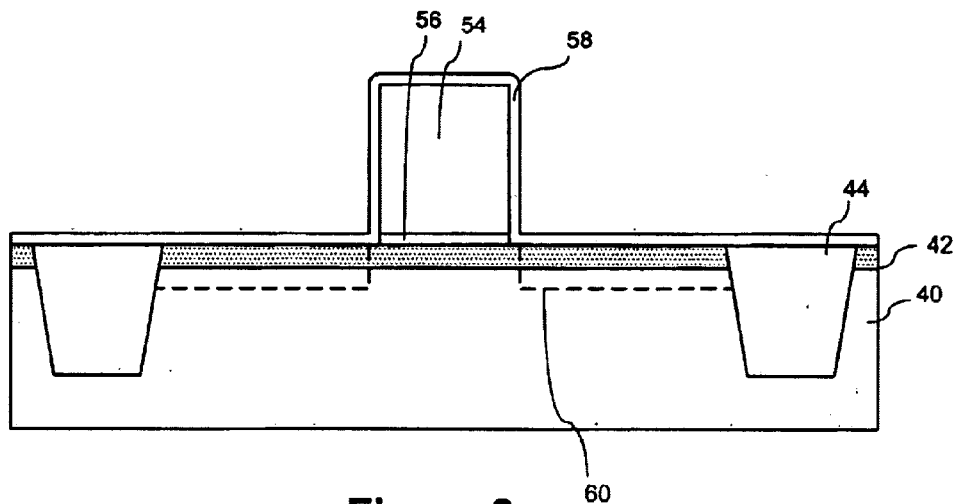

FIG. 3g shows the structure of FIG. 3f after implantation of dopant to form shallow source and drain extensions 60 in the carbon implanted strained silicon layer 42 at opposing sides of the channel region. The shallow source and drain extensions 60 typically extend into the silicon germanium layer 40 as shown in FIG. 3g. Halo regions (not shown) may be implanted prior to implantation of the shallow source and drain extensions. Halo regions are regions that are doped with a dopant that is opposite in conductivity to the dopant of the source and drain extensions 60. The halo regions help to suppress the short channel "punchthrough" effect by shortening the depletion regions at the ends of the source and drain extensions 60. The halo regions are preferably implanted using a low energy at a small angle to the surface of the substrate so that the halo regions extend beneath the gate 54 to beyond the anticipated locations of the ends of the source and drain extensions 60 after annealing. Like the source and drain extensions 60, the halo regions are formed at opposing sides of the channel region and extend toward the channel region beyond the ends of the source and drain extensions to be formed.

Figure 3H:
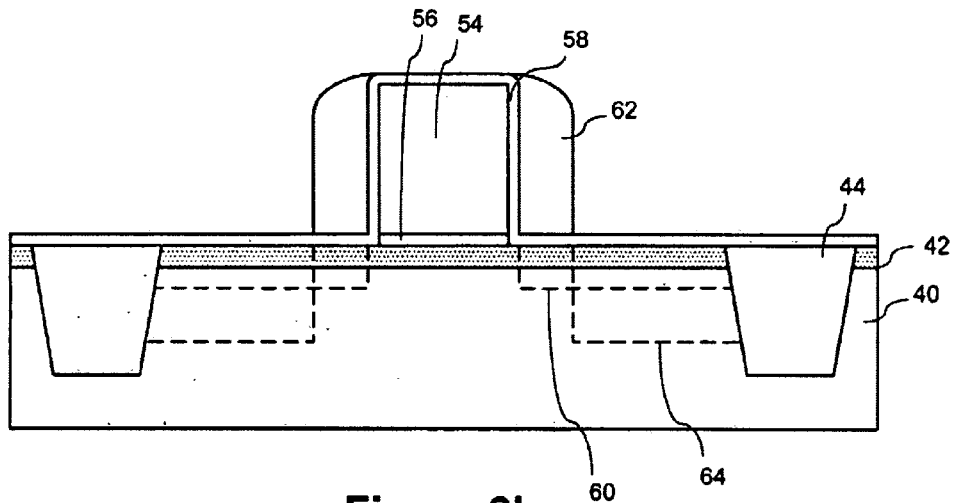

FIG. 3h shows the structure of FIG. 3g after formation of a spacer 62 around the gate 54, the gate insulator 56, and the protective layer 58, followed by implantation of dopant to form deep source and drain regions 64 in the carbon implanted strained silicon layer 42 and the silicon germanium layer 40. The spacer 62 serves as an implant mask during implantation of the deep source and drain regions 64 to define the position of the source and drain regions 64 relative to the channel region of the MOSFET. The depth of the deep source and drain regions 64 extends beyond the strained silicon layer 42 into the lower silicon germanium layer 40.

Figure 3I:
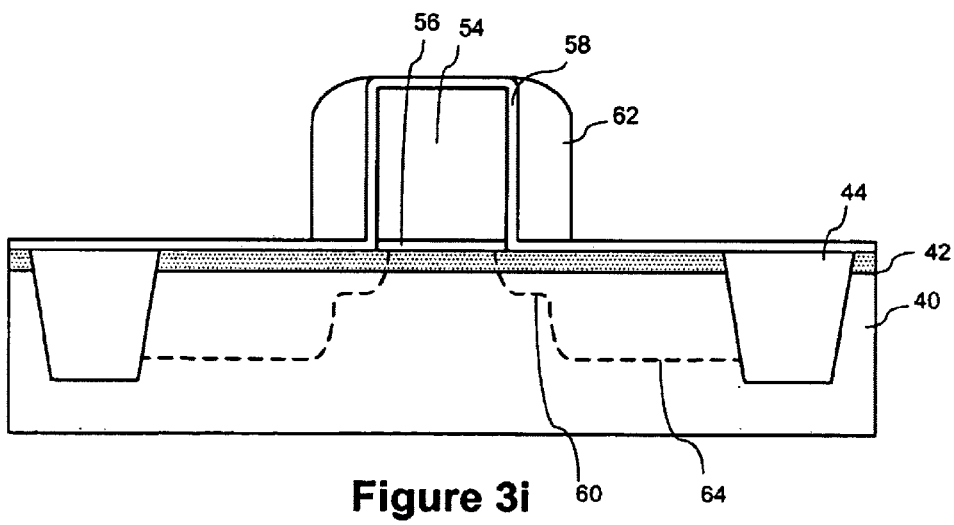

FIG. 3i shows the structure of FIG. 3h after performing rapid thermal annealing (RTA) to anneal the carbon implanted strained silicon layer 42 and silicon germanium layer 40 and to activate the dopants implanted in the shallow source and drain extensions 60 and the deep source and drain regions 64. In some implementations, this anneal may also be used to activate the implanted carbon, eliminating the need for annealing immediately after carbon implantation. During annealing some diffusion of implanted dopant occurs in the strained silicon layer 42 and the silicon germanium layer 40.

Figure 3J:
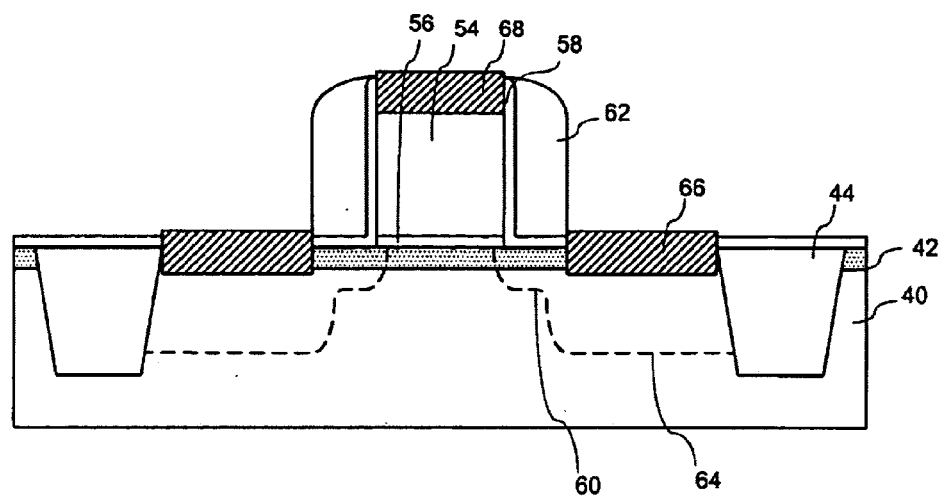

FIG. 3j shows the structure of FIG. 3i after formation of silicide contacts 66 on the source and drain regions 64 and formation of a silicide contact 68 on the gate 54. The silicide contacts are formed of a compound comprising a semiconductor material and a metal. Typically a metal such as cobalt (Co) is used, however other metals such as nickel (Ni) may also be employed. The silicide contacts are formed by patterning openings in the protective layer where suicides are to be formed, depositing a thin conformal layer of the metal over the substrate, and then annealing to promote silicide formation at the points of contact between the metal and underlying semiconductor materials, followed by removal of residual metal.

Figure 1:
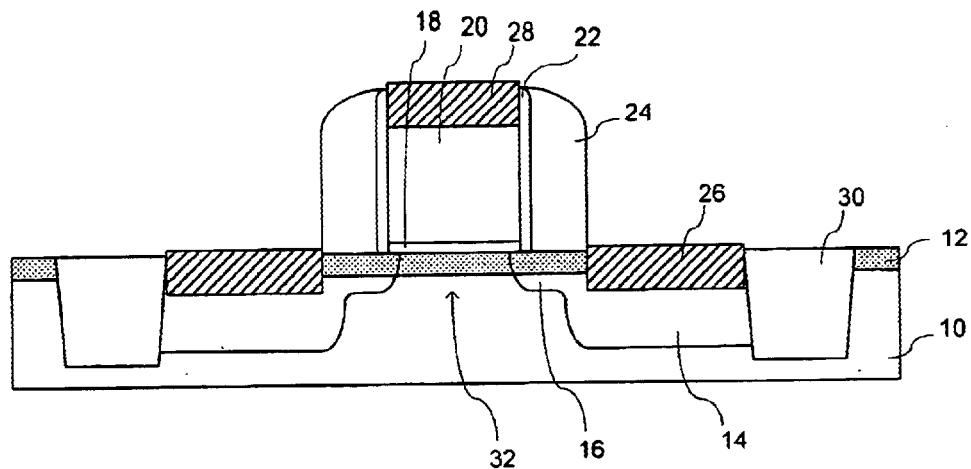
FIG. 1 shows a MOSFET that incorporates a layer of strained silicon formed in accordance with conventional processing.
Figure 2:
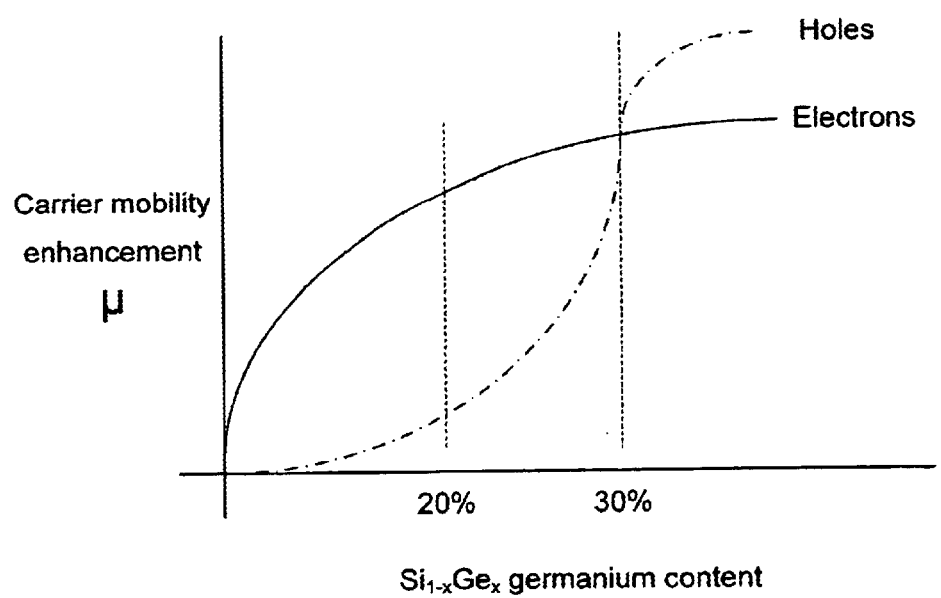
FIG. 2 shows a graph relating the mobility enhancement of electrons and holes in a strained silicon layer to the proportion of germanium in an underlying silicon germanium layer.
Figure 4:
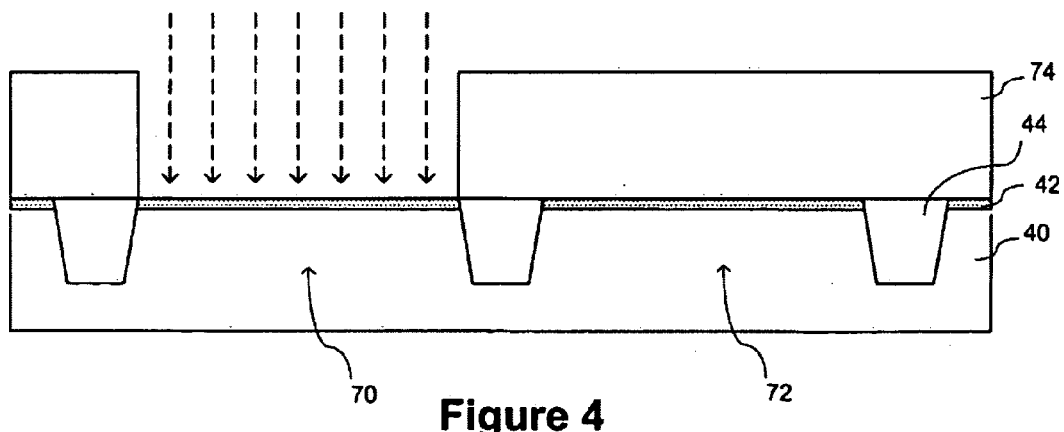
FIG. 4 shows the selective implantation of carbon in the active region of a PMOS device.

The processing of FIGS. 3a–3j may be performed to augment the strain of a strained silicon layer in any type of MOSFET. However, in CMOS applications it may be preferable to selectively perform carbon implantation on only the active regions of PMOS devices. Referring to FIG. 2, it is seen that a germanium content of approximately 30% in a supporting layer is required to provide a mobility enhancement for holes equal to the electron mobility enhancement provided by approximately 20% germanium. Thus, in accordance with one embodiment of the invention, carbon is selectively implanted into the strained silicon of PMOS components of CMOS devices to provide a hole mobility that is approximately the same as the electron mobility of the corresponding NMOS components of those devices. FIG. 4 shows the selective implantation of a PMOS region 70. An adjacent NMOS region 72 is masked, for example with a photoresist mask of suitable thickness. The carbon implantation dose in the PMOS region 70 is selected such that it raises the hole mobility in the strained silicon of the PMOS region 70 to be approximately equal to the electron mobility of the strained silicon of the NMOS regions 72. For example, where the germanium content of the underlying layer is approximately 20%, the strained silicon of the PMOS regions is implanted with approximately 1% carbon, yielding a hole mobility equivalent to approximately 30% germanium, and thus approximately equal to the electron mobility of the NMOS devices.

While the processing of FIGS. 3a–3j is presently preferred, such processing does not exclude other additional processing that may be desirable in order to further enhance the performance of the strained silicon MOSFET. For example, in some applications it may be desired to grow a second layer of silicon germanium over the layer of strained silicon either prior to or after formation of the shallow trench isolations in order to provide additional support of the tensile strain of the strained silicon layer and to resist the creation of misfit dislocations. This may facilitate the growth of strained silicon layers that are thicker than the conventional thickness of strained silicon that can be maintained on a single silicon germanium layer without substantial defects. It may also be desirable to form the shallow trench isolations prior to the formation of the strained silicon layer, even in the absence of an overlying silicon germanium layer, in order to avoid the formation of misfit dislocations during high temperature processing of the shallow trench isolations. In addition, in PMOS devices, it may be desirable to replace the strained silicon of the source and drain regions with silicon germanium in order to avoid source and drain extension distortions caused by the increased diffusion rate of boron in silicon. Similarly, it may be desirable in NMOS devices to replace a portion of the silicon germanium layer encompassing the source and drain extensions with silicon in order to avoid source and drain extension distortions caused by the increased diffusion rate of arsenic in silicon germanium. The use of additional halo regions to encompass the shallow source and drain extensions and deep source and drain regions may also be employed to counteract undesirable diffusion. It may also be desirable to replace the silicon germanium that encompasses the deep source and drain regions with silicon in order to increase the junction voltage in those regions and reduce the parasitic capacitance of the device.

Other types of processing may also be integrated with the processing of the preferred embodiment.

Accordingly, the invention may be implemented in a variety of manners. A MOSFET in accordance with one embodiment of the invention is generally characterized by source and drain regions that are formed in a semiconductor material comprising a strained silicon layer grown on a silicon germanium layer that imparts a tensile strain to the strained silicon layer, and the strained silicon layer having carbon incorporated therein to impart an additional tensile strain. The MOSFET may be a PMOS, and in the case of CMOS devices, the PMOS component of the CMOS device may selectively incorporate carbon in its strained silicon layer so that the mobility of its holes is approximately the same as the electron mobility in the NMOS component of the CMOS device. A carbon implanted strained silicon layer may also be implemented in silicon on insulator (SOI) devices by implanting carbon into a strained silicon layer grown on a silicon germanium body supported on an insulating substrate.

Figure 5:
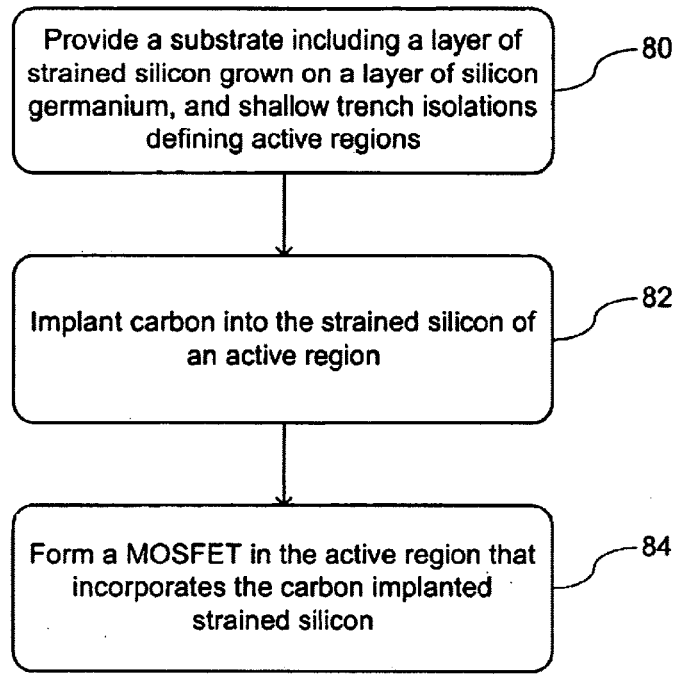
FIG. 5 shows a process flow for forming a MOSFET in accordance with the preferred embodiment and alternative embodiments.

FIG. 5 shows a process flow for forming a MOSFET that encompasses the preferred embodiment of FIGS. 3a–3j, the aforementioned additional processing and other alternatives. Initially a substrate is provided (80). The substrate includes a first layer of silicon germanium and a layer of strained silicon grown on the layer of silicon germanium, and shallow trench isolations defining active regions for formation of MOSFETs. Carbon is then implanted in the strained silicon of an active region (82). A MOSFET that incorporates the carbon implanted strained silicon layer is then formed in the active region (84). The processing to form the MOSFET typically includes patterning of a gate and gate insulator, implantation of shallow source and drain extensions and deep source and drain regions, and formation of source, drain and gate silicides. Other processing may also be performed.

Figure 6:
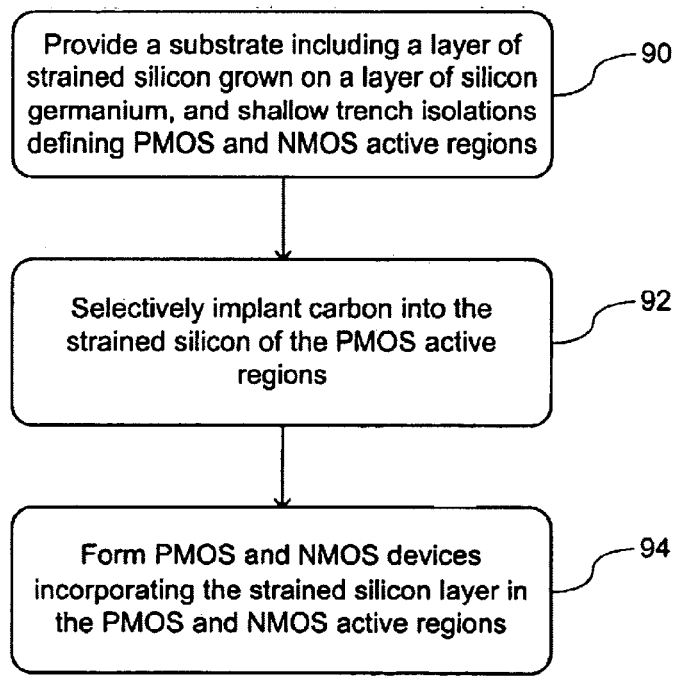
FIG. 6 shows a process flow for selectively augmenting the carrier mobility of PMOS devices in accordance with the preferred embodiment and alternative embodiments.

FIG. 6 shows a process flow for forming MOSFETs and CMOS devices that encompasses the preferred embodiment of FIGS. 3a–3j and FIG. 4. Initially a substrate is provided (90). The substrate includes a first layer of silicon germanium and a layer of strained silicon grown on the layer of silicon germanium, and shallow trench isolations defining respective active regions for formation of NMOS and PMOS devices. The strained silicon of active regions for PMOS devices is then selectively implanted with carbon (92), for example by masking the NMOS active regions with a photoresist mask of appropriate thickness. In one embodiment, the amount of implanted carbon is chosen such that the hole conductivity in the PMOS strained silicon is approximately the same as the electron mobility in the NMOS strained silicon. After removing the mask, PMOS and NMOS devices that incorporate the strained silicon layer are then formed in the respective PMOS and NMOS active regions of the substrate (94). The processing to form the NMOS and PMOS devices typically includes patterning of a gate and gate insulator, implantation of shallow source and drain extensions and deep source and drain regions, and formation of source, drain and gate suicides. Other processing may also be performed. Respective PMOS and NMOS devices may thereafter be electrically connected to form CMOS devices.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counterdoping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method of fabricating a metal oxide semiconductor field effect transistor (MOSFET), comprising:

providing a substrate comprising a layer of strained silicon grown on a layer of silicon germanium, and shallow trench isolations defining active regions of the substrate for formation of respective MOSFET devices;

implanting carbon into the strained silicon of an active region; and forming a MOSFET that incorporates the carbon implanted strained silicon layer in said active region.

2. The method claimed in claim 1, wherein the implanted carbon increases a tensile strain of the strained silicon layer in said active region.

3. The method claimed in claim 1, wherein a PMOS device is formed in said active region, and wherein an NMOS device that incorporates the strained silicon layer is formed in an active region that is not implanted with carbon.

4. The method claimed in claim 1, wherein implanting carbon comprises:
   forming a photoresist mask that leaves said active region exposed;
   implanting said carbon using the photoresist mask as an implant mask; and
   removing the photoresist mask.

5. The method claimed in claim 1, wherein the silicon germanium layer has a composition $Si_{1-x}Ge_x$, where x is in the range of 0.1 to 0.3.

6. The method claimed in claim 1, wherein forming said MOSFET comprises:
   forming a gate insulating layer on the strained silicon layer;
   forming a gate conductive layer on the gate insulating layer; and
   patterning the gate conductive layer and the gate insulating layer to form a gate overlying a gate insulator.

7. The method claimed in claim 6, wherein forming said MOSFET further comprises:
   forming a protective layer around the gate; and
   implanting shallow source and drain extensions.

8. The method claimed in claim 7, wherein implanting shallow source and drain extensions is preceded by implanting halo regions, the halo regions extending toward a channel region beyond ends of the source and drain extensions to be formed, the halo regions comprising a dopant having a conductivity type opposite to the conductivity type of a dopant of the source and drain extensions.

9. The method claimed in claim 7, wherein forming the MOSFET further comprises:
   forming a spacer around the gate; and
   implanting deep source and drain regions,
   wherein the spacer serves as an implantation mask during implanting of the deep source and drain regions.

10. The method claimed in claim 9, wherein forming the MOSFET further comprises:
    forming silicide source and drain contacts and a silicide gate contact.

11. The method claimed in claim 10, wherein the silicide source and drain contacts and the silicide gate contact comprise nickel.

12. The method claimed in claim 11, wherein forming silicide source and drain contacts and a silicide gate contact is preceded by annealing to activate implanted dopants.

13. The method claimed in claim 1, wherein providing the substrate comprises growing the layer of silicon germanium on a semiconductor substrate.

14. The method claimed in claim 13, further comprises growing the layer of strained silicon on the layer of silicon germanium.

15. The method claimed in claim 14, wherein the layer of silicon germanium and the layer of strained silicon are grown together in a single continuous in situ deposition process.

16. A method of fabricating metal oxide semiconductor field effect transistors (MOSFETs), comprising:
    providing a substrate comprising a layer of silicon germanium and a layer of strained silicon grown on the layer of silicon germanium, and shallow trench isolations defining respective active regions of the substrate for formation of NMOS and PMOS devices;
    selectively implanting carbon into the strained silicon of the PMOS active regions using the mask as an implant mask; and
    forming PMOS devices and NMOS devices that incorporate the strained silicon in the respective PMOS and NMOS active regions of the substrate.

17. The method claimed in claim 16, wherein the implanted carbon increases a tensile strain of the strained silicon layer.

18. The method claimed in claim 16, wherein a hole mobility in carbon implanted strained silicon of said PMOS devices is approximately equal to an electron mobility in strained silicon of said NMOS devices having no implanted carbon.

19. The method claimed in claim 16, further comprising electrically connecting one of said PMOS devices and one of said NMOS devices to form a CMOS device.

20. The method claimed in claim 16, wherein selectively implanting carbon is preceded by masking active regions for NMOS devices using a photoresist mask, and
    wherein selectively implanting carbon is followed by removing the photoresist mask.

* * * * *